US011129272B2

(12) United States Patent
Papenfuss et al.

(10) Patent No.: US 11,129,272 B2
(45) Date of Patent: Sep. 21, 2021

(54) RELAY ARRANGEMENT WITH IMPROVED HEAT DISSIPATION AND CONVERTER DEVICE HAVING A RELAY ARRANGEMENT OF THIS KIND

(71) Applicant: SMA Solar Technology AG, Niestetal (DE)

(72) Inventors: Frank Papenfuss, Nieste (DE); Lars Bethke, Goettingen (DE); Thomas Kuehn, Warburg (DE); Christian Gehrke, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/519,358

(22) Filed: Jul. 23, 2019

(65) Prior Publication Data

US 2019/0350073 A1 Nov. 14, 2019

Related U.S. Application Data

(63) Continuation of application No. PCT/EP2018/050138, filed on Jan. 3, 2018.

(51) Int. Cl.
*H05K 1/02* (2006.01)
*H01B 7/42* (2006.01)
*H01H 47/00* (2006.01)

(52) U.S. Cl.
CPC ........... *H05K 1/0209* (2013.01); *H01B 7/421* (2013.01); *H01H 47/004* (2013.01); *H05K 1/0212* (2013.01)

(58) Field of Classification Search
None
See application file for complete search history.

(56) References Cited

U.S. PATENT DOCUMENTS

| 6,493,228 | B1 | 12/2002 | Suzuki |
| 6,712,623 | B2 * | 3/2004 | Sumida ............... B60R 16/0239 174/541 |
| 9,531,170 | B2 * | 12/2016 | Pal ....................... H01R 25/162 |
| 9,853,421 | B2 * | 12/2017 | Binder .................. H01S 5/4025 |
| 2001/0026134 | A1 * | 10/2001 | Fukumoto ............. H02H 7/222 318/430 |
| 2002/0130557 | A1 | 9/2002 | Dickhoff |

(Continued)

FOREIGN PATENT DOCUMENTS

DE 19518522 A1 11/1996
EP 0465693 A1 1/1992

OTHER PUBLICATIONS

International Search Report dated Mar. 14, 2018 in connection with International Application PCT/EP2018/050138.

*Primary Examiner* — Courtney L Smith
(74) *Attorney, Agent, or Firm* — Eschweiler & Potashnik, LLC

(57) ABSTRACT

A relay arrangement includes at least two series-connected relays, which are mechanically and electrically connected to a main printed circuit board via first terminals and second terminals, and at least one flat conductor for conducting current between the at least two series connected relays. The flat conductor is mechanically connected to the main printed circuit board and electrically and thermally connected to the first terminals of the relays, and the at least one flat conductor is configured to dissipate heat produced during operation of the relays.

7 Claims, 5 Drawing Sheets

(56) References Cited

U.S. PATENT DOCUMENTS

| | | |
|---|---|---|
| 2010/0226160 A1 | 9/2010 | Prior |
| 2014/0145804 A1* | 5/2014 | Pagani ................ H01H 1/0036 335/180 |
| 2016/0006365 A1* | 1/2016 | Perreault ................ H02M 1/14 363/89 |
| 2017/0318659 A1 | 11/2017 | Chin |

\* cited by examiner

RELAY ARRANGEMENT WITH IMPROVED HEAT DISSIPATION AND CONVERTER DEVICE HAVING A RELAY ARRANGEMENT OF THIS KIND

CROSS REFERENCE TO RELATED APPLICATIONS

This application is a continuation of International Patent Application number PCT/EP2018/050138, filed on Jan. 3, 2018, which claims priority to German Patent Application number 10 2017 101 236.2, filed on Jan. 23, 2017, and is hereby incorporated by reference in its entirety.

FIELD

The disclosure relates to a relay arrangement with improved heat dissipation and a converter apparatus having such a relay arrangement. In particular, the disclosure serves to improve the dissipation of the heat produced during operation of relays.

BACKGROUND

In converter apparatuses, for example inverters, relay arrangements having at least two series-connected relays may be used in the form of a grid disconnector. Inverters that, for example, feed energy from decentralized, regenerative sources into an integrated grid must be able to be disconnected reliably from the grid in the event of a fault in the integrated grid in order not to endanger people working to eliminate the fault. For this reason, there are regulations that such grid disconnectors are to be designed to have single-fault safety, which means that the connection can be reliably disconnected even in the case of failure of one relay. Therefore, two relays, in the case of larger installations two contactors, per grid supply path are often connected in series so that, in the event of a defect in one relay, the series-connected second one can carry out the grid disconnection.

In the case of electronic components, for example semiconductor switches, it is known that they produce a significant power loss during operation thereof. For this reason, semiconductor switches are often arranged in close contact with heat sinks or fans to conduct a cooling air stream along the components in order to dissipate the heat produced during operation. The maximum power loss to be expected is specified in data sheets of the respective electronic components. The amount of heat to be dissipated can thus be calculated or simulated, for example, using simulation models for a desired circuit arrangement.

In contrast, for relays, mostly typical values are given. Neither data sheets nor "application notes" refer to the maximum of heat produced during operation. Within the context of architectures employing at least two series-connected relays, surprisingly high power losses have been identified in relays during regular operation, said high power losses being able to thermally overload the relay arrangement, for which reason cooling measures are to be taken into consideration. In addition, for reasons of cost, the desire is often to choose very small relays with lightweight construction which have a low current-carrying capacity resulting therefrom. The heat dissipation properties are even lower owing to a less solid embodiment of the component parts in the case of a compact design. This results in a further motivation to provide improved heat dissipation of relays.

The prior art discloses busbars to which semiconductor modules are applied, which busbars serve to conduct current to the semiconductor modules and are in extensive thermal contact with a cooling device, as described, for example, in DE 10 2004 018 469 B3. The cooling itself is performed by a very compact cooling device, which, together with the busbars, is denoted here as a busbar assembly. The semiconductor modules themselves comprise semiconductor switches on an electrically conductive substrate, wherein the substrate serves both for the electrical contact connection and the thermal coupling of the semiconductor module. It is disadvantageous here that a plurality of component parts are required for current conduction and heat dissipation.

WO 2015/184546 A1 discloses a busbar to which electronic switches are applied and which connects the switches to a cooling arrangement in a T-shaped configuration. Different component parts are also required here for the current conduction and the heat dissipation.

In relation to relays, until now no explicit heat dissipation measures have been proposed since a low development of heat was assumed. Low amounts of heat should thus suffice by means of the contact connection of the relay on a main printed circuit board and the transmission of heat to the conductor tracks located on the main printed circuit board.

SUMMARY

The higher maximum contact resistances identified in the context of the disclosure during operation of the relays may lead to thermal overloading of the relay arrangement if it has not been dimensioned accordingly.

It is therefore an object of the present disclosure to specify a relay arrangement with improved heat dissipation that is cost-effective, remains compact in design and manages with as few additional components as possible.

A relay arrangement with improved heat dissipation according to the disclosure has at least two series-connected relays, which are mechanically and electrically connected to a main printed circuit board via first and second terminals. At least one flat conductor is provided between the at least two series-connected relays for conducting current between them. The flat conductor is mechanically connected to the main printed circuit board and electrically and thermally connected to the first terminals of the relays for dissipating of the heat produced during operation of the relays. The flat conductors, in one embodiment, should be both good electrical conductors and good thermal conductors, e.g. they could be made from copper sheet. Owing to the flat embodiment, heat produced during operation of the relays can be distributed to the flat conductors and dissipated to the surroundings.

In one embodiment, the relay arrangement according to the disclosure has a plurality of flat conductors, which are isolated from one another and which are arranged spatially parallel and adjacent to one another. The plurality of flat conductors, which are isolated from one another, each connect electrically series-connected first terminals of multi-pole relays or a plurality of first terminals of different relays to one another. The plurality of flat conductors, which are insulated from one another, may be laminated busbars, solid copper sheets or similar.

In a further embodiment, the plurality of flat conductors are embodied as a multilayer printed circuit board. In contrast to the standard circuit board having two copper outer layers, in multilayer printed circuit boards, also referred to as "multilayer boards", further copper layers are also integrated in the core.

The embodiment of the flat conductor as a multilayer printed circuit board has the advantage that a plurality of flat conductors and the isolation required between said flat conductors are provided at the same time. Therefore, for two series-connected relays each having, for example, four switching contacts, the electrical connection and the required heat dissipation can be ensured by way of a printed circuit board having at least four conductor tracks as an integral component. The particularly flat design of multilayer printed circuit boards ensures good heat transmission from the first terminals of the, for example, multi-pole relays since large distances for the thermal connection of the plurality of first terminals to the multilayer printed circuit board do not have to be overcome.

In one advantageous embodiment of the relay arrangement according to the disclosure, the multilayer printed circuit board is arranged substantially perpendicular to the plane of the main printed circuit board. A bracket for fixing the position of the multilayer printed circuit board relative to the plane of the main printed circuit board may be provided. In said embodiments, a convection air stream can advantageously additionally support the heat dissipation of the multilayer printed circuit board.

In a further advantageous embodiment of the relay arrangement according to the disclosure, the first terminals of the relays are formed by terminals of the relay that are embodied with a larger line cross section compared to the second terminals and are connected directly to a stationary operating contact of the relay. The stationary operating contact of relays is usually embodied to be more solid than the movable operating contact. Good heat transmission can thus be realized by way of a tight connection of the flat conductors to the terminals of the relay that are connected directly to the stationary operating contact.

In a further advantageous embodiment of the relay arrangement according to the disclosure, the multilayer printed circuit board has at least one central copper layer and two outer copper layers surrounding the central copper layer. In this case, the central copper layer is connected to a measuring device, and the outer copper layers are connected to the same of the first terminals. The current is thus conducted from a first contact of a relay to the first contact of the other relay connected in series therewith via at least two layers of the multilayer printed circuit board, wherein at least one further layer is located between said both two layers.

In a further advantageous embodiment, an intermediate potential between the at least two series-connected relays is determined at the central copper layer by means of the measuring device.

The central copper layer is connected, for example, to a voltage measurement system, as a result of which the electrical potential at the point between the two series-connected relays can be determined via a capacitive coupling. Since an AC voltage is applied at this location when the contact of at least one of the relays is closed, the capacitive coupling is advantageous because possible DC voltage components are blocked out. By targeted switching of the two series-connected relays and given knowledge of the voltage ratios upstream and downstream of the two series-connected relays, it is thus possible, by determining the voltage ratios at the connecting point between the two series-connected relays, to check both relays for the correct function thereof.

The disclosure further relates to a converter apparatus having a plurality of inverter bridges and a relay arrangement according to one of the above-described embodiments of the relay arrangement according to the disclosure as a grid disconnector.

As explained further above, there are often regulations with respect to converter apparatuses that feed into an integrated grid so that said converter apparatuses can be disconnected from the grid reliably in the event of a fault in the integrated grid. To this end, two relays or, in the case of larger installations, contactors per grid supply path are often connected in series so that, in the event of a defect in a relay, the series-connected second can carry out the grid disconnection.

In one advantageous embodiment of the converter apparatus according to the disclosure, said converter apparatus comprises a plurality of multiphase inverter bridges. The currents of a phase of the plurality of inverter bridges, that is to say the respective currents of the same phase of the individual inverter bridges, are each individually conducted via relay contacts of the at least two series-connected relays. The currents of a phase are combined at one of the second terminals of the at least two series-connected relays to form a joint phase connection.

In a further advantageous embodiment of the converter apparatus according to the disclosure, the currents of a phase of the plurality of inverter bridges flow via different relay contacts of the same relay.

If the converter apparatus according to the disclosure has, for example, two three-phase inverter bridges, there are two output lines of phase 1 (analogous for phase 2 and 3). Said two output lines can be led individually, for example, via two series-connected two-pole relays. The two output lines can be combined at a grid-side output of the second relay and be fed as one output line to the grid connection of the converter apparatus.

In another advantageous embodiment of the converter apparatus according to the disclosure, the currents of a phase of the plurality of inverter bridges flow via relay contacts of different relays.

In the example described above, each of the two output lines can thus be led, for example, via in each case two series-connected single-pole relays and combined at one of the grid-side outputs of the four single-pole relays. For two three-phase inverter bridges, the three phases of a bridge can be led, for example, in each case via two series-connected three-pole relays, with the result that four three-pole relays are required, or the same phases can be led via two series-connected two-pole relays, with the result that six two-pole relays are required.

The embodiment of the above-described grid disconnection relay in the form of a relay arrangement according to the disclosure results in a likewise compact design, which, owing to the reliable dissipation of heat, leads to robust and safe operation of the converter apparatus.

The disclosure is described below on the basis of embodiments using drawings from which, in joint consideration with the features of the claims, further features, properties and advantages of the disclosure emerge.

DETAILED DESCRIPTION

Figure 1:
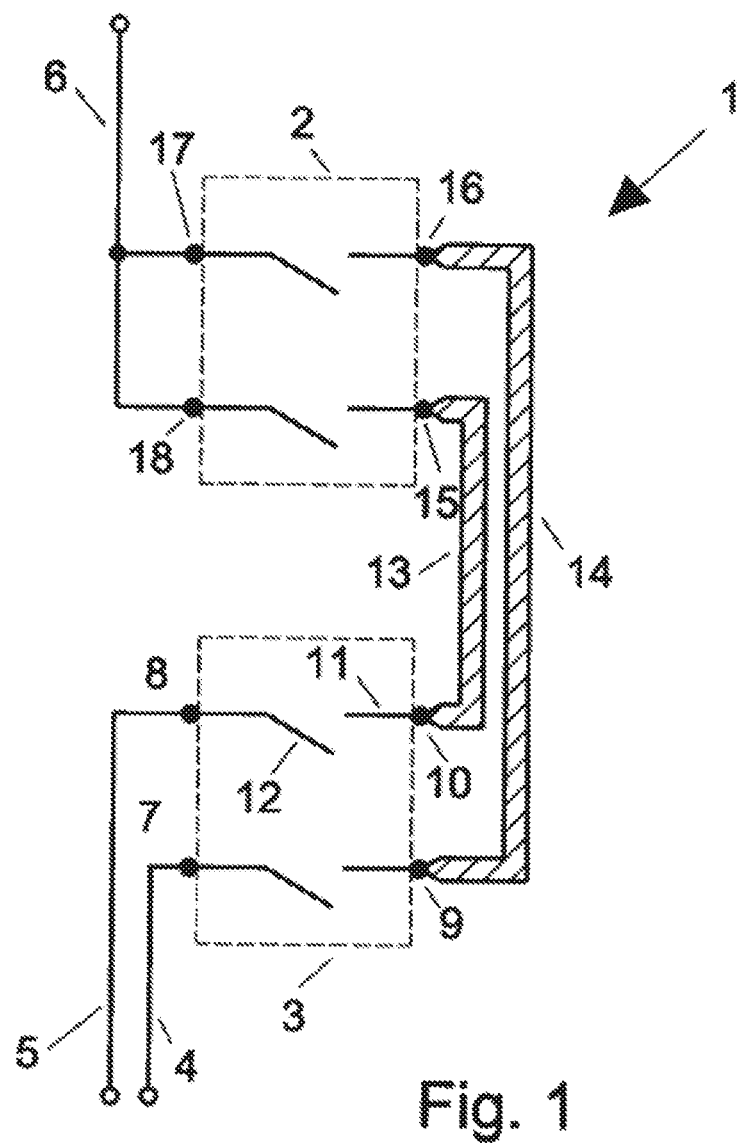
FIG. 1 shows an embodiment of a relay arrangement according to the disclosure.

FIG. 1 shows an embodiment of a relay arrangement 1 according to the disclosure comprising two series-connected relays 2, 3, wherein input connections 4, 5 of an electronic circuit (not shown) are led to the second terminals 7, 8 of relay 3. If the relay contacts 12, 11 are closed, current can flow from terminal 8 to a first terminal 10 of relay 3. The first terminal 10 of relay 3 is connected in series with the first terminal 15 of relay 2 via a flat conductor 13. The current continues to flow via a switching contact of relay 2 and the second terminal 18 thereof to the output connection 6 of the relay arrangement 1.

The flat conductor 13 on the one hand establishes the electrical contact between the series-connected relays 2, 3 and, owing to the flat configuration thereof (see also FIG. 2) and the selection of both an electrically and thermally conductive material, serves to dissipate the heat produced during operation of the relays 2, 3.

The first terminal 9 of relay 3 is entirely analogously connected in series with the first terminal 16 of relay 2 via the flat conductor 14. The current flowing via the other switching contact of relay 2 to the second terminal 17 thereof is combined there with the current from terminal 18, with the result that the currents of the input connections 4, 5 are combined in an output connection 6 of the relay arrangement 1. In this way, the currents from the input connections 4, 5 are conducted in parallel via two series circuits composed of relays. It is thus possible to use cost-effective relays with a low current-carrying capacity and still reliably switch relatively high currents and ensure the stable and safe operation owing to the improved heat dissipation.

The flat conductors 13, 14 connect the respective first terminals 9, 10, 15, 16 of the relays 2, 3, wherein the first terminals 9, 10, 15, 16 are each connected to the stationary contacts, for example, contact 11 of relay 3. In contrast thereto, the second terminals 7, 8, 17, 18 of the relays 2, 3 are connected to the movable contacts of the relays 2, 3, for example contact 12 of relay 3. The stationary operating content of the relays is usually embodied to be more solid than the movable operating contact. Good heat transmission can thus be realized by way of a tight connection of the flat conductors to the first terminals 9, 10, 15, 16.

Figure 2:
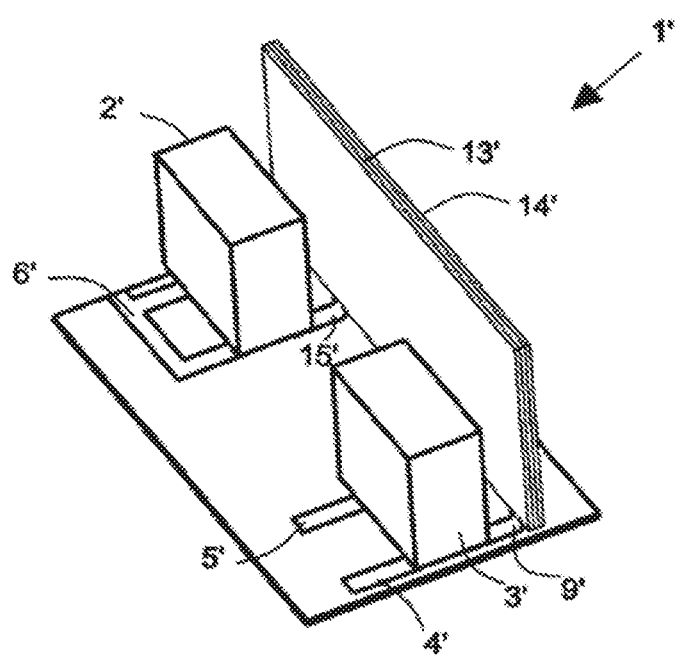
FIG. 2 shows a perspective illustration of the embodiment according to FIG. 1.

FIG. 2 shows a perspective illustration of the embodiment according to FIG. 1. The input connections 4', 5' of an electronic circuit (not shown) are embodied as conductor tracks on a main printed circuit board (not shown). The relays 2', 3' are soldered into the main printed circuit board and thereby are connected electrically to the conductor tracks and at the same time mechanically to the main printed circuit board itself, with the result that the housings of the relays 2', 3' are perpendicular to the plane of the main printed circuit board. The flat conductors 13', 14' are likewise arranged perpendicular to the plane of the main printed circuit board, which favors the dissipation of the heat produced during operation of the relays. The flat conductors 13', 14' may be embodied as laminated busbars having an electrically insulating layer between them or as a multilayer printed circuit board, which are likewise soldered into the main printed circuit board like the relays.

Figure 3:
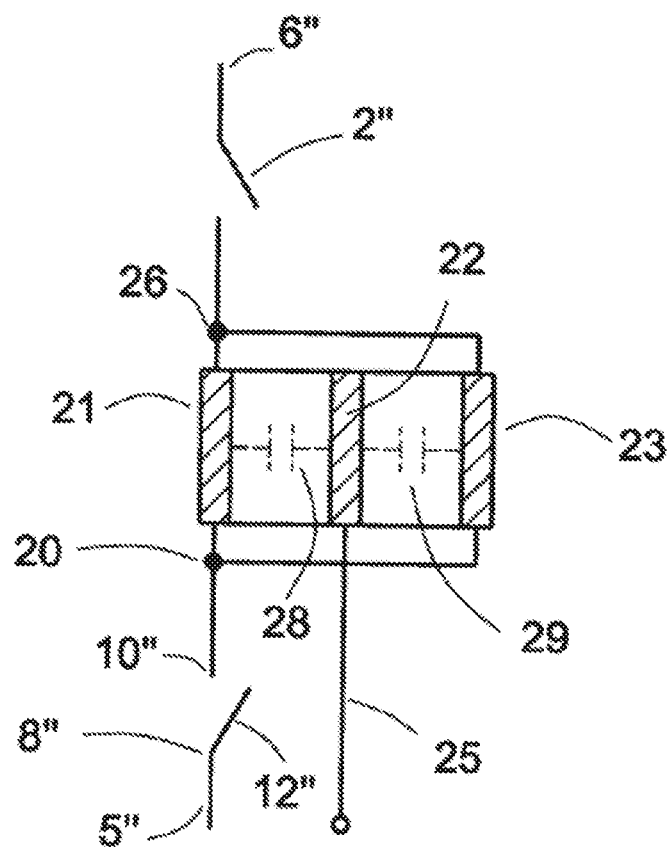
FIG. 3 shows a further configuration of a relay arrangement according to the disclosure.

FIG. 3 shows a further configuration of a relay arrangement 1 according to the disclosure, wherein an input connection 5" is connected to the second terminal 8" of the relay 12". When the relay 12" is closed, the current flows via the first terminal 10" of the relay 12" to a connection point 20 from which the current is divided over two flat conductors 21, 23 or two conductor tracks 21, 23 of a multilayer printed circuit board. Further heat spreading can thus be realized. A central conductor track 22, which can be contact-connected by means of a connection point 25, is located between the conductor tracks 21, 23. Here, for example, a measuring device (not shown) can be connected. After the division of the current over the two flat conductors 21, 23 or two conductor tracks 21, 23, the current is combined again at the connection point 26 in order to pass through the relay contact 2" and to be fed to the output connection 6".

The outer copper layers 21, 23 are thus connected to the same of the first terminals of the respective relay contacts 12", 2". The inner copper layer 22 is coupled to the outer copper layers 21, 23 via virtual capacitances 28, 29, which means that said capacitances 28, 29 do not constitute separate components but are produced intrinsically through the parallel arrangement of the copper layers.

The correct function of the relay contacts 12", 2" can be checked by way of a measuring device connected to the connection point 25 together with other measuring devices arranged in the current course upstream and downstream of the relays.

Figure 4:
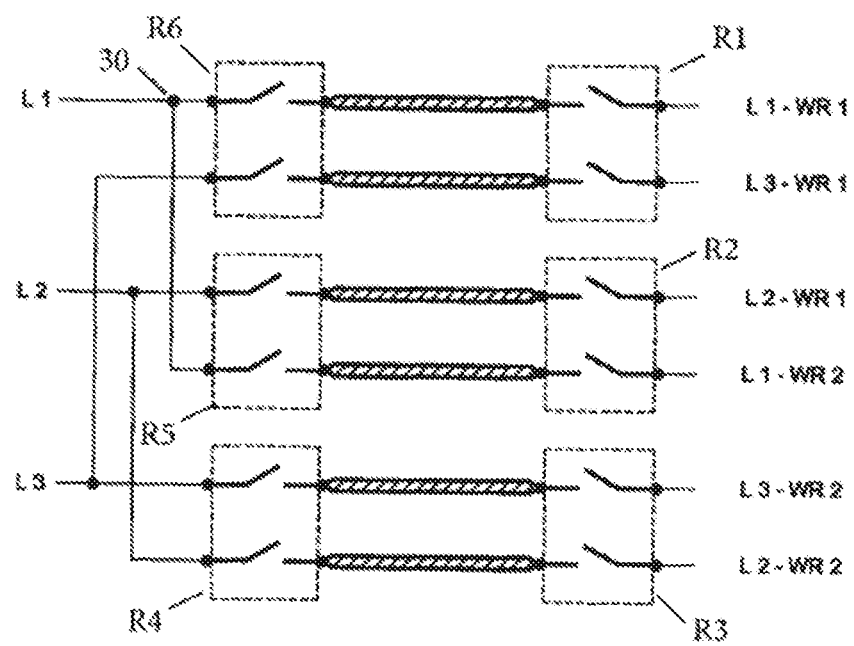
FIG. 4 shows an advantageous configuration of a grid disconnector having a relay arrangement according to the disclosure.

FIG. 4 shows an advantageous configuration of a grid disconnector, for example, for a converter apparatus having a plurality of inverter bridges WR 1, WR 2 (not shown). The plurality of inverter bridges WR 1, WR 2 form a three-phase current, which is combined upstream of the output of the converter apparatus, that is to say said inverter bridges are parallel inverter bridges, wherein the current for one phase of the three-phase output current is formed by in each case two inverter bridges. FIG. 4 shows a possible division of the phases of a three-phase output current over two-pole relays R1, R2, R3, R4, R5, R6. The current for phase L1 of the two inverter bridges is denoted here by L1-WR 1 and L1-WR 2 and, coming from the inverter bridges, is conducted via in each case one relay arrangement according to the disclosure formed by R1 and R6 and R2 and R5 and combined at an output connection 30. The respective other switching contact of the two-pole relays is used by other phases or other inverter bridges. The current for phase L2 of the two inverter bridges is denoted by L2-WR 1 and L2-WR 2 and, coming from the inverter bridges, is conducted via in each case one relay arrangement according to the disclosure formed by R2 and R5 and R3 and R4. In this example, the combination of R3 and R4 and R1 and R6 is used for L3. That is to say the respective currents of the same phase of the individual inverter bridges are conducted individually via relay contacts of different relays. The currents of a phase are combined at one of the second terminals of the at least two series-connected relays of the relay arrangement according to the disclosure to form a joint phase connection.

Figure 5:
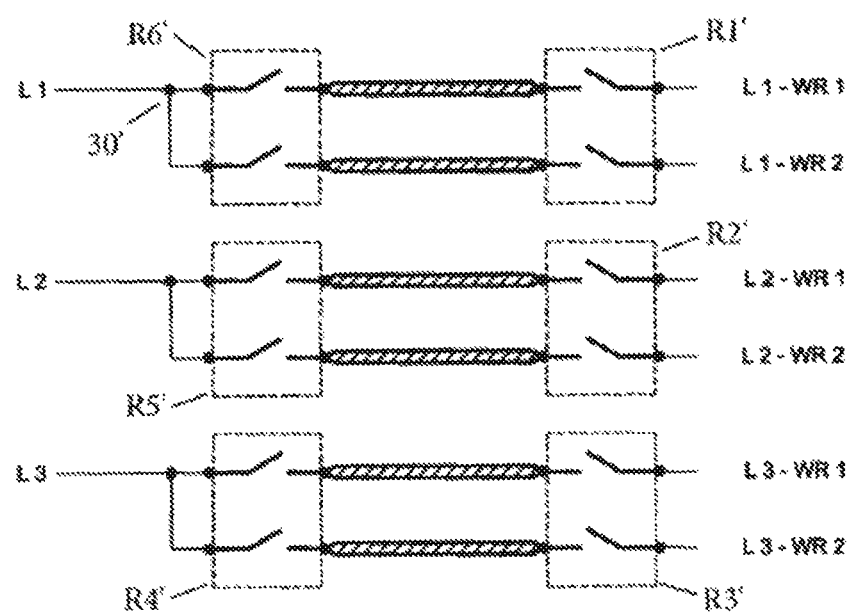
FIG. 5 shows a further advantageous configuration of a grid disconnector having a relay arrangement according to the disclosure.

FIG. 5 shows a further advantageous configuration of a grid disconnector having a relay arrangement according to the disclosure, wherein another division of the phases of a three-phase output current over two-pole relays R1', R2', R3', R4', R5', R6' is shown. The currents for phase L1 of the two inverter bridges-as denoted in FIG. 4 by L1-WR 1 and L1-WR 2-are, coming from the inverter bridges, conducted via a relay arrangement according to the disclosure formed by R1' and R6'. The current component L1-WR 1 of inverter bridge 1 is conducted via a contact of relay R1' and the second current component L1-WR 2 is conducted via the other contact of relay R1' and then, according to the relay arrangement according to the disclosure, via the two contacts of the series-connected relay R6'. The currents of phase L1 are combined at the second terminal 30' of the relay R6'.

The invention claimed is:

1. A relay arrangement, comprising:
   at least two multi-pole series-connected relays, which are mechanically and electrically connected to a main printed circuit board via first terminals and second terminals, and
   a plurality of flat conductors which are electrically isolated from one another and which are arranged at least partially spatially parallel and adjacent to one another for conducting current between the at least two multi-pole series connected relays, wherein each of the plurality of flat conductors is mechanically connected to the main printed circuit board and electrically and thermally connected to the first terminals of the multi-pole series-connected relays, wherein the plurality of flat conductors are configured to dissipate heat produced during operation of the relays.

2. The relay arrangement as claimed in claim 1, wherein the plurality of flat conductors are embodied within a multilayer printed circuit board.

3. The relay arrangement as claimed in claim 2, wherein the multilayer printed circuit board is arranged substantially perpendicular to a plane of the main printed circuit board.

4. The relay arrangement as claimed in claim 2, further comprising a bracket configured to fix a position of the multilayer printed circuit board relative to a plane of the main printed circuit board.

5. The relay arrangement as claimed in claim 1, wherein the first terminals of the relays are formed by terminals of the relays that are embodied with a larger line cross section compared to the second terminals thereof, and are connected directly to a stationary operating contact of the respective relay.

6. The relay arrangement as claimed in claim 2, wherein the multilayer printed circuit board comprises at least one central copper layer and two outer copper layers surrounding the central copper layer, and wherein the central copper layer is connected to a measuring device and the outer copper layers are connected to a same one of the first terminals.

7. The relay arrangement as claimed in claim 6, wherein an intermediate potential between the at least two series-connected relays is determined at the central copper layer by means of the measuring device.

* * * * *